United States Patent
Cenedese

(10) Patent No.: US 7,315,005 B2
(45) Date of Patent: Jan. 1, 2008

(54) CONTROL PANEL WITH ILLUMINATED CAPACITIVE TOUCH-CONTROL SWITCHES

(75) Inventor: Claudio Cenedese, Pasian de Prato (IT)

(73) Assignee: Electrolux Home Products Corporation N.V., Zaventem (BE)

( * ) Notice: Subject to any disclaimer, the term of this patent is extended or adjusted under 35 U.S.C. 154(b) by 0 days.

(21) Appl. No.: 11/409,568

(22) Filed: Apr. 24, 2006

(65) Prior Publication Data

US 2006/0243575 A1   Nov. 2, 2006

(30) Foreign Application Priority Data

Apr. 25, 2005  (SE)  .................................. 0500917

(51) Int. Cl.
*H01H 9/00*  (2006.01)
(52) U.S. Cl. ........................ 200/310; 200/600; 341/33; 345/173
(58) Field of Classification Search ........ 200/308–317, 200/512–519, 600; 341/33; 345/173, 176
See application file for complete search history.

(56) References Cited

U.S. PATENT DOCUMENTS

| | | | |
|---|---|---|---|
| 5,510,813 A * | 4/1996 | Makinwa et al. ........... | 345/173 |
| 5,917,165 A | 6/1999 | Platt et al. | |
| 6,362,815 B1 * | 3/2002 | Leenhouts ................... | 345/173 |
| 6,403,904 B1 | 6/2002 | Schilling | |
| 6,664,489 B2 | 12/2003 | Kleinhans et al. | |
| 6,738,051 B2 * | 5/2004 | Boyd et al. .................. | 345/176 |
| 7,002,555 B1 * | 2/2006 | Jacobsen et al. ............ | 345/173 |

FOREIGN PATENT DOCUMENTS

EP           1139695          1/2001

* cited by examiner

*Primary Examiner*—Elvin Enad
*Assistant Examiner*—M. Fishman
(74) *Attorney, Agent, or Firm*—Pearne & Gordon LLP

(57) ABSTRACT

Control panel of the touch-switch comprising: an external control board with transparent surface portions, devices for illuminating the transparent surface portions from the inside, capacitive-type detecting or sensing devices on the backside of the control board and adapted to detect the presence, on the front side of the control board. The devices for illuminating comprise a plurality of illumination channels comprised laterally between pairs of opaque septum-like partitions arranged in parallel manner on the backside of the control board. The capacitive-type detecting devices comprise conductive elements applied either on the mutually facing surfaces of contiguous septum-like partitions or on one of the surfaces and a ground not comprised between the septum-like partitions. The illuminating channels are delimited on the front side by the external control board at the transparent surface portions and, on the back side, by support members arranged at the rear side of the septum-like partitions.

8 Claims, 3 Drawing Sheets

CONTROL PANEL WITH ILLUMINATED CAPACITIVE TOUCH-CONTROL SWITCHES

The present invention refers to an improved kind of control and display panel provided with a plurality of capacitive-type touch-control switches preferably for use in electric household appliances.

Control and display panels are largely known in the art, which comprise appropriate switching means that are operated by simply touching them with an external mass, i.e. bringing an external mass into contact with them, these switching means being furthermore able to selectively receive operating commands and to give out a visual indication that these operating commands have been duly received.

As used here, the term "touch control" is intended to mean one or more actuating arrangements that enable a specific electric circuit to be opened or closed—and therefore operate as switching devices—by simply touching or establishing a contact with a surface, to which there are appropriately associated means adapted to detect the presence of or even the contact with an external mass.

These touch-control switching means are largely known in the art and are preferably associated to so-called capacitive devices, i.e. devices that are based on the capacity variation of a circuit that is generated by said external mass coming into contact with or touching said surface. These capacitive-type devices are mainly preferred owing to a generally greater simplicity and lower cost of the component parts and the circuits required by them.

Control panels that use actuating arrangements of the touch-control type have a number of inherent advantages, i.e.:
 they are easily cleaned,
 they are fully effective in preventing liquids or dirt from seeping or penetrating therethrough, i.e. they are fully impervious to and unaffected by such liquids and dirt,
 they allow for most interesting aesthetical, functional and ergonomic design solutions to be devised at low costs.

In the great majority of cases, one of the limitations implied by touch-control techniques is due to the absence of a direct reaction mechanism, i.e. a means that would enable a user outside to be immediately given a feedback information that a command has been duly received. In other words, the user has no way of immediately perceive physically whether he/she has actually entered a command, i.e. operated the intended control device. Electromechanical-type switches or push-buttons are inherently provided with such feature of enabling a user to immediately perceive that a command has been actually entered, thanks to the physical movement of their parts or a clicking or similar noise associated to the actuation thereof.

In view of overcoming such limitation, a solution known from the disclosure in the U.S. Pat. No. 6,664,489 B1 to E.G.O. would be to provide a sensor element with a sensor surface, said sensor surface being a part of a capacitive touch switch, and being fitted to the underside of a control surface of said capacitive touch switch, wherein said sensor surface is at least partially light-transmitting and is illuminated from below by a light source, the light-guide means are provided for flux of light from said light source to said sensor surface, and said light-guide means shield said light source of a touch switch from the environment and from a remaining underside of said control surface.

The solution disclosed in the above-mentioned US patent is certainly an improvement over the general prior art, particularly as far as the simplicity from a construction point of view and the feature of providing an absolutely direct kind of feed-back information are concerned, in that the same control circuit that receives the switching command, and is therefore affected by said command, changes its state and generates in this way a signal for a light source to emit an appropriate light flux to the backside surface of the control panel. Owing to this light source being practically a part of the control circuit itself, there is no possibility at all for the switching signal to be received by the touch-control switch and the corresponding feedback light signal not to be transmitted automatically.

However, this solution has two major drawbacks that make it quite less efficient to use in practice.

The first one of these drawbacks is connected with the way in which the arrangement operates. As a matter of fact, the capacity sensing surface 12 is provided between the light source 17, which is constituted by LEDs, and the glass-ceramic top surface 14, through which the light must be able to be visible from the outside; the fact that said surface 12 is interposed between a light source and a person that must be capable of seeing it, causes the visibility of said light source to be quite less certain and, anyway, certainly attenuated, even in the case that such measures are taken as those that are described in the above-cited patent.

The second drawback is connected with the mode of construction; the surface 12, in fact, is applied against and held in contact with the backside of the glass-ceramic top surface 14 by the same conductive members 18, 25 that are also used to establish the electric contact between the printed circuit 16 and the surface 12 itself. This causes this solution to prove undesirably delicate and frail, since any possible displacement or movement out of alignment of the conductive members 18, 25 is likely to cause the same capacity sensing surface 12 to suffer critical alterations or even to move farther away, thereby impairing the operation of the whole device.

It would therefore be desirable, and it is actually a main purpose of the present invention, to provide a control panel comprised of a control board provided with capacitive touch-control switching arrangements that are adapted to directly transmit to the outside a light signal to confirm that a command has been received, and are capable to do away with the above-described drawbacks in that the light signal has not to pass through a capacitive conductive element and the construction of the whole control board is resistant to shocks and mechanical stresses, in particular tangentially applied ones.

According to another purpose of the present invention, this control panel shall furthermore be capable of being manufactured in an easy and low-cost manner with the use of existing, readily available technologies. It shall further be capable of being conveniently assembled and mounted, without any risk for the correct operating state and capability of the control circuit and, in particular, the capacitive elements to be impaired.

According to the present invention, these aims, along with further ones that will be apparent from the following description, are reached in a particular kind of control panel provided with a board and associated capacitive touch-control switching circuits and related light signals, which is made and operates as recited in the appended claims.

Anyway, features and advantages of the present invention will be more readily understood from the description that is given below by mere way of non-limiting example with reference to the accompanying drawings, in which.

Figure 1:
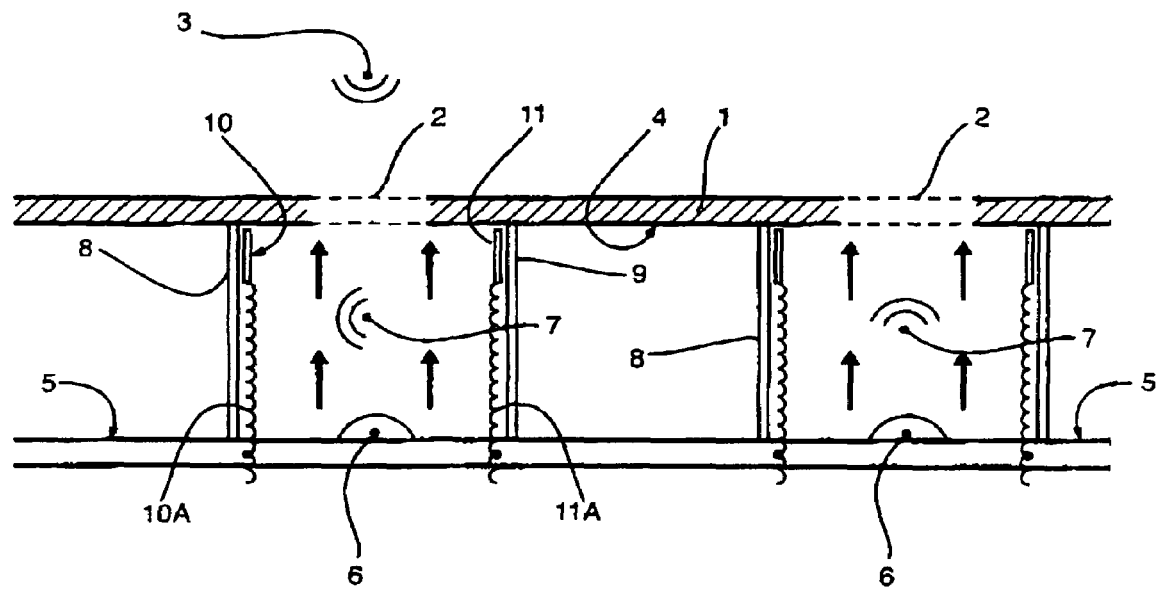
FIG. 1 is an orthogonal sectional view of an embodiment of a control panel according to the present invention.

As already mentioned hereinbefore, the technology used to provide the touch-control switching function is the one based on differential capacitive measurement. This technology is based on the fact that the human body is able to alter, by its own presence, the capacity of an electric circuit.

These capacity variations are usually quite modest, but anyway of a sufficient extent to affect an electronic circuit. It should anyway be noticed that, in the case of a capacitive touch switch, what is actually performed is not an absolute measurement of capacity, but rather a differential measurement in order to be able to identify any situation that may be brought about by capacity variations of a permanent nature deriving from effects that differ from an external mass establishing a contact with or touching the device.

When talking about capacity, or variations thereof, in this context, what is actually meant is the stray capacitance of an electric circuit; for a capacity to be present, there must be provided:

two conducting armatures and a dielectric interposed between these two armatures.

With reference to the above-noted Figures, the control panel according to the present invention comprises:

an external control board 1, in which there are provided light-transmitting, i.e. transparent surface portions 2, which allow for the light striking upon the opposite inner surface 4 thereof to be transferred towards the outside 3, a support member 5 situated on the side of said inner surface 4 in a parallel arrangement relative thereto and provided with a plurality of light sources 6, which are capable of being operated selectively and are configured so as to project respective light beams towards respective ones of said transparent surface portions 2, wherein said light sources are preferably constituted by LEDs.

Ultimately, between said LEDs and said corresponding transparent surface portions 2 on the control board 1 there are formed respective illumination channels 7, which will not interfere with each other and, in practice, are the respective free, i.e. fully void spaces that are comprised between the various LEDs and the bijectively mapping, i.e. corresponding transparent surface portions 2.

In order to prevent the light generated by a LED from undergoing any scattering or from glimmering astray, so that it cannot reach a transparent surface portion 2 different from the corresponding one on the control board, each such illumination channel 7 is physically delimited on two opposite sides thereof by means of two opaque septum-like partitions 8, 9 that are arranged in a substantially orthogonal manner relative to said support member 5 and said control board 1. Therefore, each assembly comprising:

a transparent surface portion 2 of the control board 1, a respective LED 6, a pair of said septum-like partitions 8, 9 that delimitate a respective illumination channel 7 formed in this way, and the portion of said support member 5 that carries said respective LED 6 practically forms an autonomous illumination cell that is capable of being activated selectively.

A first aim is thereby reached in that no element capable of attenuating the light emitted, or interfering therewith, is actually interposed between each LED and the corresponding transparent surface portion 2.

As far as the capability of working and performing as a capacitive touch-control switching arrangement is concerned, according to a preferred embodiment of the present invention the two conductive armatures are obtained by arranging two electrically conductive surface elements 10, 11 on portions of the mutually facing surfaces of said septum-like partitions 8, 9, as this is most clearly, although symbolically illustrated in FIG. 1.

These electrically conductive surface elements 10, 11 will of course be preferably located as close to said control board 1 as possible, almost in contact therewith, i.e. as close as possible to the area of the control board that is touched for actuation, thereby causing the electric field thereof to undergo a modification.

Each such conductive surface element 10, 11 is connected to the electric control circuit via respective connections 10A and 11A; these connections may be of any known kind as generally used in the art, so that they shall not be described any further here.

Figure 2:
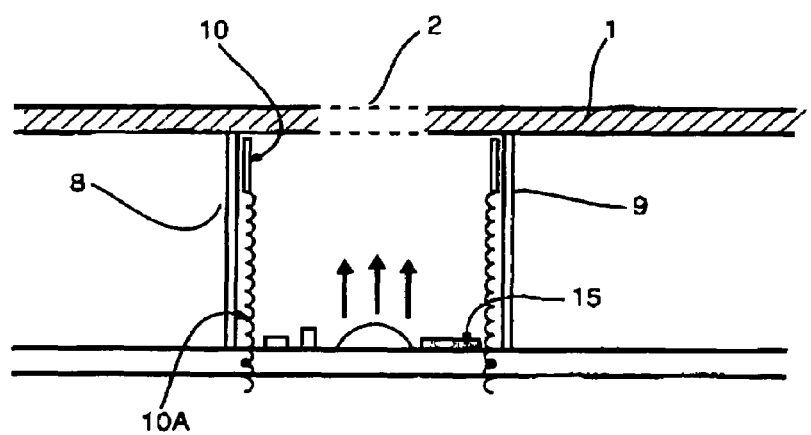
FIG. 2 is an orthogonal sectional view of an alternative embodiment of a control panel according to the present invention.
Figure 3:
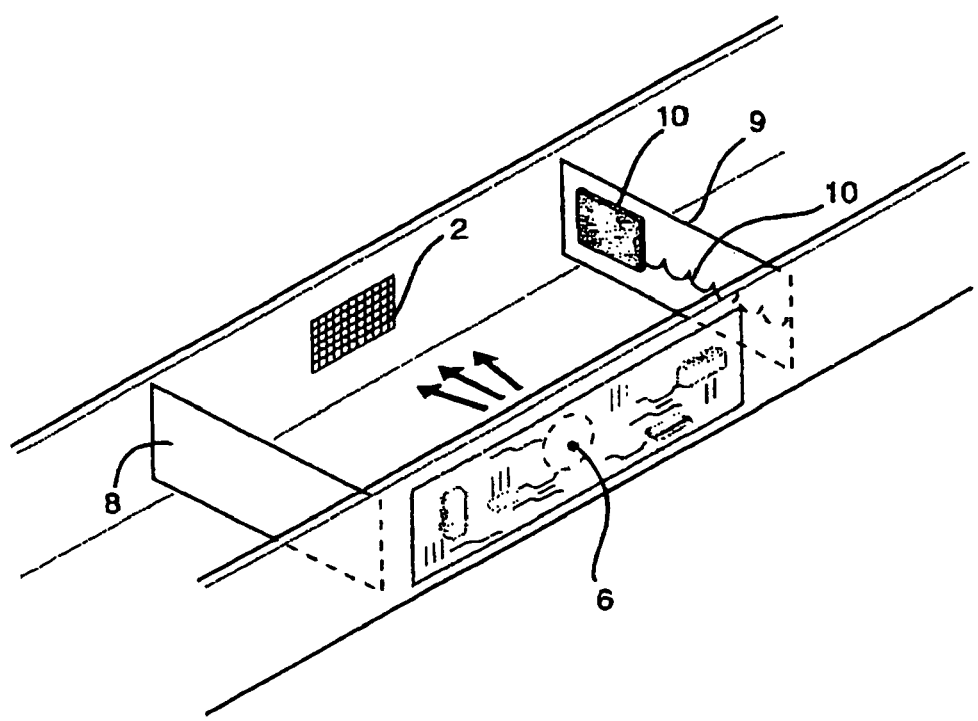
FIG. 3 is a simplified perspective view of a portion of the control panel shown in FIG. 2.

With reference to FIG. 2, a possible variant of the above described embodiment may consist in arranging one of said conductive surface elements 10, along with its own connection 10A, just on a single septum-like partition 8, whereas the other conductive surface element 11 is physically eliminated, the function thereof being however ensured by a ground plane 15 provided on the support member 5 itself. The embodiment of FIG. 1 does not comprise such a ground (15) between the septum-like partitions (8, 9), in contact thereto.

The support member 5, on which the LEDs 5 are arranged, may most conveniently be used to also hold the control circuit for both the LEDs themselves and the conductive surface elements 10, 11, so that this support element takes the form of a printed-circuit board (PCB) comprising the control circuit (not shown specifically in the Figure) and the LEDs which said conductive surface elements 10, 11 are connected to. Furthermore, from this printed-circuit board there are branching off the connecting links 13, 14 that transmit on the outside of the control panel the switching signals detected by said conductive surface elements 10, 11 and processed by the same control circuit.

In an advantageous manner, said ground plane 15 is constituted by the same ground available on said printed-circuit board, thereby obtaining an optimum extent of compactness and inexpensiveness of the control panel according to the present invention.

Figure 4:
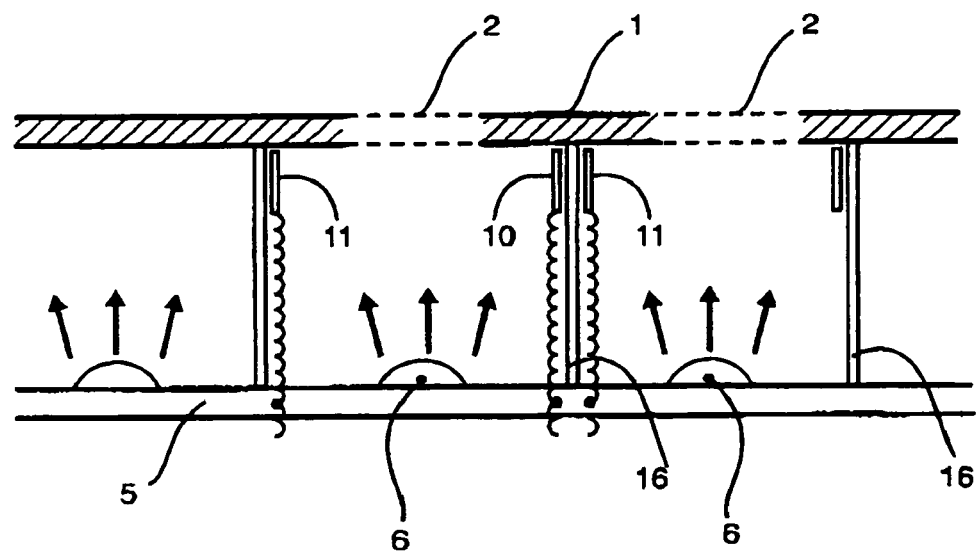
FIG. 4 is a sectional view corresponding to the one shown in FIG. 1, however illustrating an improved embodiment of the control panel according to the present invention.

With reference to FIG. 4, the invention may be further improved when the commands to be transmitted to the control panel, and the corresponding light signals to be transmitted to the outside, are not a single one, but rather a plurality. In this case, in fact, it may prove advantageous for the various illumination channels to be brought near to each other so that the two contiguous septum-like partitions, that would in this way come almost into contact with each other, can be incorporated into a single one septum-like partition 16, which will however work of course for both adjacent illumination channels, thereby introducing a further simplification in both construction and production, as well as a greater compactness of the control panel itself.

Figure 5:
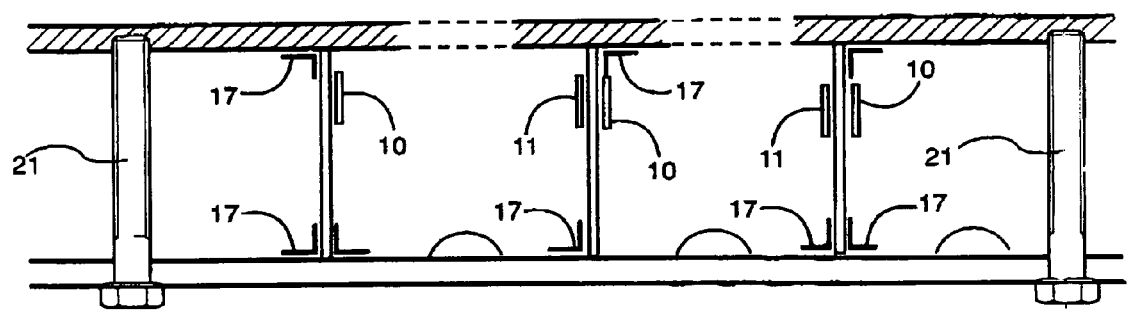
FIG. 5 is a schematical view of a further improved embodiment of the control panel illustrated in FIG. 4.

In view of ensuring an adequate extent of mechanical strength and firmness of the control panel, the septum-like partitions 8, 9 may be applied both to said printed-circuit board and, either in alternative thereto or in combination therewith, said inner surface 4 of the control board 1 by means of light conventional means 17 adapted to only carry and support said septum-Like partitions and the related conductive elements 10, 11, since adequate mechanical solidity of the junction between the printed-circuit board and the control board 1 can in fact be effectively reached by applying suitable fastening means 21 at a pre-determined distance, as this is clearly shown in FIG. 5, while avoiding to cause said opaque septum-like partitions to also perform as mechanical strengthening means.

These partitions will therefore not be subject to load-sustaining or displacement stresses, so that the constancy of the conductive elements 10 and 11 in their position is ensured along with the peculiar functional state and character thereof.

Also the second aim of the present invention, i.e. the mechanical robustness of the whole control panel assembly, is in this way easily reached through the use of simple, low-cost means that are anyway effective in ensuring long-term efficiency of the touch-control function associated with the control board and the devices being provided therewithin.

The invention claimed is:

1. Control panel of the touch-switch or sensor-switch type comprising:
   an external control board (1) provided with at least partly transparent surface portions (2),
   means for illuminating said transparent surface portions from the inside,
   capacitive-type detecting or sensing means provided on the backside of said control board and adapted to detect the presence, on the front side of the control board, of bodies that modify the electric field containing said detecting means,
   wherein said means for illuminating comprise:
   a plurality of illumination channels (7) comprised laterally between pairs of opaque septum-like partitions (8, 9) that are arranged in substantially parallel manner relative to each other and substantially orthogonal to said control board (1), and located in the space on the backside of said control board,
   and in that said capacitive-type detecting or sensing means comprise conductive elements (10, 11) applied substantially either on the mutually facing surfaces of contiguous septum-like partitions (8, 9) or on one of said surfaces and a ground not comprised between said septum-like partitions (8, 9), in contact thereto.

2. The control panel according to claim 1, wherein said illumination channels are delimited on the front side by said external control board (1) at respective ones of said transparent surface portions (2) and, on the back side, by one or more support members (5) arranged at the rear side of said septum-like partitions.

3. The control panel of the touch-switch or sensor-switch type according to claim 1, wherein it comprises appropriate circuits for actuating and controlling said illuminating means, that said circuits are arranged on said support means (5), which comprise a printed-circuit board (PCB), and that said conductive elements (10, 11) are electrically connected via respective connections (10A, 11A) to said actuation and control circuits on said printed-circuit board (PCB).

4. The control panel of the touch-switch or sensor-switch type to claim 3, wherein said illuminating means comprise a plurality of LED-type diodes that are respectively arranged on said printed-circuit boards and oriented towards the backside surface of said transparent portions, through respective ones of said illumination channels, and are further activable in a selective manner.

5. The control panel according to claim 4, wherein said LEDs are connected to said actuation and control circuits and are arranged on said printed-circuit board (PCB).

6. The control panel according to claim 1, wherein said conductive elements comprise, alternatively or in combination,
   metal foils applied onto said septum-like partitions,
   conductive paint
   clips.

7. The control panel according to claim 1, wherein said external control board (1) and said illuminating means are in a direct relation with each other, without any means or device being arranged or provided therebetween that might even partially intercept, attenuate, distort, scatter or screen the light reaching the backside surface of said external control board.

8. The control panel according to claim 1, wherein at least a portion of each one of said septum-like partitions (8, 9) delimitates two distinct ones of said illumination channels arranged on the two opposite sides of each said septum-like partition.

* * * * *